US012671389B1

(12) United States Patent (10) Patent No.: US 12,671,389 B1

Friend et al. (45) Date of Patent: Jun. 30, 2026

(54) UNAPODIZATION

(71) Applicant: The Regents of the University of California, Oakland, CA (US)

(72) Inventors: James Friend, San Diego, CA (US); Naiqing Zhang, San Diego, CA (US); Cecile Floer, San Diego, CA (US); Amihai Horesh, San Diego, CA (US)

(73) Assignee: The Regents of the University of California, Oakland, CA (US)

( * ) Notice: Subject to any disclaimer, the term of this patent is extended or adjusted under 35 U.S.C. 154(b) by 146 days.

(21) Appl. No.: 18/563,858

(22) PCT Filed: May 27, 2022

(86) PCT No.: PCT/US2022/031292

§ 371 (c)(1),
(2) Date: Nov. 22, 2023

(87) PCT Pub. No.: WO2022/251596

PCT Pub. Date: Dec. 1, 2022

Related U.S. Application Data

(60) Provisional application No. 63/194,143, filed on May 27, 2021.

(51) Int. Cl.
H03H 9/145 (2006.01)

(52) U.S. Cl.
CPC ...... H03H 9/1452 (2013.01); H03H 9/14502 (2013.01); H03H 9/14544 (2013.01)

(58) Field of Classification Search
CPC ..... H03H 9/1452; H03H 9/14502; H03H 9/13
See application file for complete search history.

(56) References Cited

U.S. PATENT DOCUMENTS

| 4,472,653 A | * | 9/1984 | Yamada | ............... | H03H 9/1452 |
| | | | | | 310/313 C |
| 5,654,680 A | * | 8/1997 | Kwan | .................. | H03H 9/6406 |
| | | | | | 310/313 C |
| 5,663,695 A | * | 9/1997 | Tanaka | ............... | H03H 9/02779 |
| | | | | | 333/195 |

(Continued)

FOREIGN PATENT DOCUMENTS

JP 63-238706 A * 10/1988

*Primary Examiner* — Quan Tra
(74) *Attorney, Agent, or Firm* — FisherBroyles, LLP

(57) ABSTRACT

An unapodized interdigital transducer apparatus, system, and associated methods. The apparatus includes a substrate, a pair of first electrodes oppositely positioned on the substrate, where an aperture is formed between the pair of first electrodes, and a plurality of variable length second electrodes arranged using a predetermined pattern defined by each second electrode in the plurality of second electrodes being coupled to one of the first electrodes in the pair of first electrodes and being configured to extend into the aperture. At least one second electrode in the plurality of second electrodes coupled to one of the first electrodes in the pair of first electrodes has the same length as at least another second electrode in the plurality of second electrodes coupled to another first electrode in the pair of first electrodes. A surface acoustic wave is generated upon application of electrical current to the pair of the first electrodes.

20 Claims, 7 Drawing Sheets

(56)                References Cited

U.S. PATENT DOCUMENTS

| | | | | |
|---|---|---|---|---|
| 6,025,763 | A * | 2/2000 | Morimoto | H03H 9/6483 |
| | | | | 310/313 C |
| 6,057,630 | A | 5/2000 | Yanagihara et al. | |
| 6,114,927 | A * | 9/2000 | Matsuda | H03H 9/14526 |
| | | | | 333/195 |
| 6,791,236 | B1 * | 9/2004 | Abramov | H03H 9/14517 |
| | | | | 310/313 C |
| 7,061,346 | B2 * | 6/2006 | Schemies | H03H 9/1452 |
| | | | | 310/313 C |
| 7,170,372 | B2 * | 1/2007 | Ruile | H03H 9/02992 |
| | | | | 310/313 C |
| 7,453,334 | B1 * | 11/2008 | Abbott | H03H 9/02944 |
| | | | | 333/195 |
| 10,418,970 | B2 * | 9/2019 | Daimon | H03H 9/1457 |
| 2002/0079988 | A1 | 6/2002 | Endou et al. | |
| 2002/0158715 | A1 | 10/2002 | Nakamura et al. | |
| 2005/0110367 | A1 | 5/2005 | Kondratiev | |
| 2007/0008052 | A1 * | 1/2007 | Wada | H03H 9/02992 |
| | | | | 333/196 |
| 2007/0046400 | A1 * | 3/2007 | Wada | H03H 9/14532 |
| | | | | 333/196 |
| 2007/0091079 | A1 | 4/2007 | Sano et al. | |
| 2008/0258843 | A1 * | 10/2008 | Stokes | H03H 9/1452 |
| | | | | 29/25.35 |

* cited by examiner

| $s\ (x = s\lambda)$ | $n$ | Finger pair # $N_m$ |
|---|---|---|
| 9 | 7 | {16,22,14,10,14,22,16} |
| 11 | 5 | {21,18,12,18,21} |
| 11 | 7 | {13,21,13,12,13,21,13} |
| 13 | 5 | {15,21,7,21,15} |
| 13 | 7 | {9,16,20,9,20,16,9} |
| 17 | 5 | {11,20,15,20,11} |
| 17 | 7 | {13,24,10,4,10,24,13} |
| 18 | 5 | {13,20,6,20,13} |
| 18 | 6 | {16,20,15,15,20,16} |
| 18 | 7 | {13,22,8,8,8,22,13} |
| 18 | 8 | {11,21,13,5,5,13,21} |
| 19 | 7 | {15,20,9,9,20,15} |
| 20 | 7 | {22,22,17,4,17,22,22} |

700

Provide an unapodized interdigital transducer disposed on a substrate — 702

Generate a surface acoustic wave — 704

UNAPODIZATION

CROSS-REFERENCE TO RELATED APPLICATIONS

This application is a national stage entry of Patent Cooperation Treaty Application No. PCT/US2022/031292 filed May 27, 2022, entitled "UNAPODIZATION," which claims priority to U.S. Provisional Application No. 63/194,143 filed May 27, 2021, entitled "UNAPODIZATION," the disclosures of which are incorporated herein by reference in their entirety.

TECHNICAL FIELD

The current subject matter generally relates to acoustofluidic applications, and in particular, to unapodized devices and associated methods.

BACKGROUND

Surface acoustic waves (SAW) have underpinned many acoustofluidic applications. But the typical straight, full-width interdigital transducers used to generate these waves can be problematic. Fresnel diffraction of the propagating SAW causes strong non-uniformity in the wave's amplitude as it propagates across the substrate, leading to flow variations, recirculation, and peculiar wetting phenomena in fluids driven by such waves. These have led to many research projects and publications, but, ultimately, uniform fluid flow from SAW-driven streaming remains elusive.

SUMMARY

In some implementations, the current subject matter relates to an apparatus, that may include an unapodized interdigital transducer ("IDT", "transducer", and/or surface acoustic wave device ("SAW device")). The apparatus may include a substrate. It may also include a pair of first electrodes oppositely positioned on the substrate. An aperture may be formed between the pair of first electrodes. Further, the apparatus may include a plurality of variable length second electrodes arranged using a predetermined pattern. The pattern may be defined by each second electrode in the plurality of second electrodes being coupled to one of the first electrodes in the pair of first electrodes and being configured to extend into the aperture. At least one second electrode in the plurality of second electrodes that may be coupled to one of the first electrodes in the pair of first electrodes has the same length as at least another second electrode in the plurality of second electrodes coupled to another first electrode in the pair of first electrodes. A surface acoustic wave (SAW) may be generated by the apparatus upon application of electrical current to the pair of the first electrodes.

In some implementations, the current subject matter may include one or more of the following optional features. The pair of first electrodes and the plurality of variable length second electrodes may form an unapodized interdigital transducer disposed on the substrate.

In some implementations, the plurality of second electrodes may be arranged in a plurality of pairs of second electrodes. The second electrodes in a pair of second electrodes in the plurality of pairs may have same length. Alternatively, or in addition to, second electrodes in a pair of second electrodes in the plurality of pairs may have a different length.

In some implementations, at least one second electrode in the plurality of second electrodes may have a first thickness and at least another second electrode in the plurality of second electrodes has a second thickness. The first thickness being different from the second thickness.

In some implementations, the interdigital transducer may be at least one of: an output interdigital transducer and an input interdigital transducer.

In some implementations, the surface acoustic wave may be a uniform surface acoustic wave.

In some implementations, the apparatus may also include a plurality of variable length non-conducting third electrodes. Each non-conducting third electrode in the plurality of non-conducting third electrodes may be coupled to at least one first electrode in the pair of first electrodes. At least one non-conducting third electrode may be positioned opposite to at least one second electrode in the plurality of second electrodes.

In some implementations, the plurality of second electrodes may be arranged in one or more groups of second electrodes. At least group of second electrodes may include at least one second electrode having a different length than a length of at least another second electrode in at least another group.

In some implementations, each pair of adjacent second electrodes in the plurality of second electrodes are coupled to the same first electrode in the pair of first electrodes and are positioned a predetermined distance apart.

In some implementations, the predetermined pattern may be dependent on a distribution of an amplitude of the generated surface acoustic wave determined at one or more locations corresponding to positions of one or more second electrodes in the plurality of second electrodes within the aperture. The predetermined pattern of the plurality of second electrodes may be configured to cause generation of a predetermined acoustic pressure across the aperture. The predetermined acoustic pressure may be constant. Alternatively, or in addition to, the predetermined acoustic pressure may be configured to vary at each location corresponding to a position of each second electrode in the plurality of second electrodes within the aperture.

In some implementations, the current subject matter relates to a method for operating the unapodized interdigital transducer, as described above, according to some implementations of the current subject matter. An unapodized interdigital transducer disposed on a substrate may be provided. The unapodized interdigital transducer including a pair of first electrodes oppositely positioned on the substrate, wherein an aperture is formed between the pair of first electrodes, and a plurality of variable length second electrodes arranged using a predetermined pattern defined by each second electrode in the plurality of second electrodes being coupled to one of the first electrodes in the pair of first electrodes and being configured to extend into the aperture. At least one second electrode in the plurality of second electrodes that may be coupled to one of the first electrodes in the pair of first electrodes may have the same length as at least another second electrode in the plurality of second electrodes coupled to another first electrode in the pair of first electrodes. A surface acoustic wave may be generated upon application of electrical current to the pair of the first electrodes.

In some implementations, the providing may also include determining a distribution of an amplitude of the generated surface acoustic wave determined at one or more locations corresponding to positions of one or more second electrodes in the plurality of second electrodes within the aperture, and generating the predetermined pattern, including selecting a number of second electrodes for positioning within the aperture, determining corresponding lengths of selected electrodes, and determining positions of the selected electrodes.

In some implementations, design of an unapodized IDT may implement use of one or more integrated and/or external reflectors, thereby converting a single-phase unidirectional interdigital transducer (SPUDT) into an unapodized IDT, such that, the lateral distribution of the SAW is as desired a fixed distance from the SPUDT while ensuring the SAW is generated principally from one side of the aperture alone.

In some implementations, the current subject matter's unapodization processes and/or designs, as discussed herein, may likewise be applied to chirp transducers, focusing transducers, tapered transducers, and/or stepped interdigital transducers to facilitate a lateral distribution of the SAW amplitude on the substrate to render it uniform at a desired distance from the IDT.

The details of one or more variations of the subject matter described herein are set forth in the accompanying drawings and the description below. Other features and advantages of the subject matter described herein will be apparent from the description and drawings, and from the claims. While certain features of the currently disclosed subject matter are described for illustrative purposes in relation to optical edge detection, it should be readily understood that such features are not intended to be limiting. The claims that follow this disclosure are intended to define the scope of the protected subject matter.

BRIEF DESCRIPTION OF THE DRAWINGS

The accompanying drawings, which are incorporated in and constitute a part of this specification, show certain aspects of the subject matter disclosed herein and, together with the description, help explain some of the principles associated with the disclosed implementations. In the drawings.

DETAILED DESCRIPTION

Figure 1:
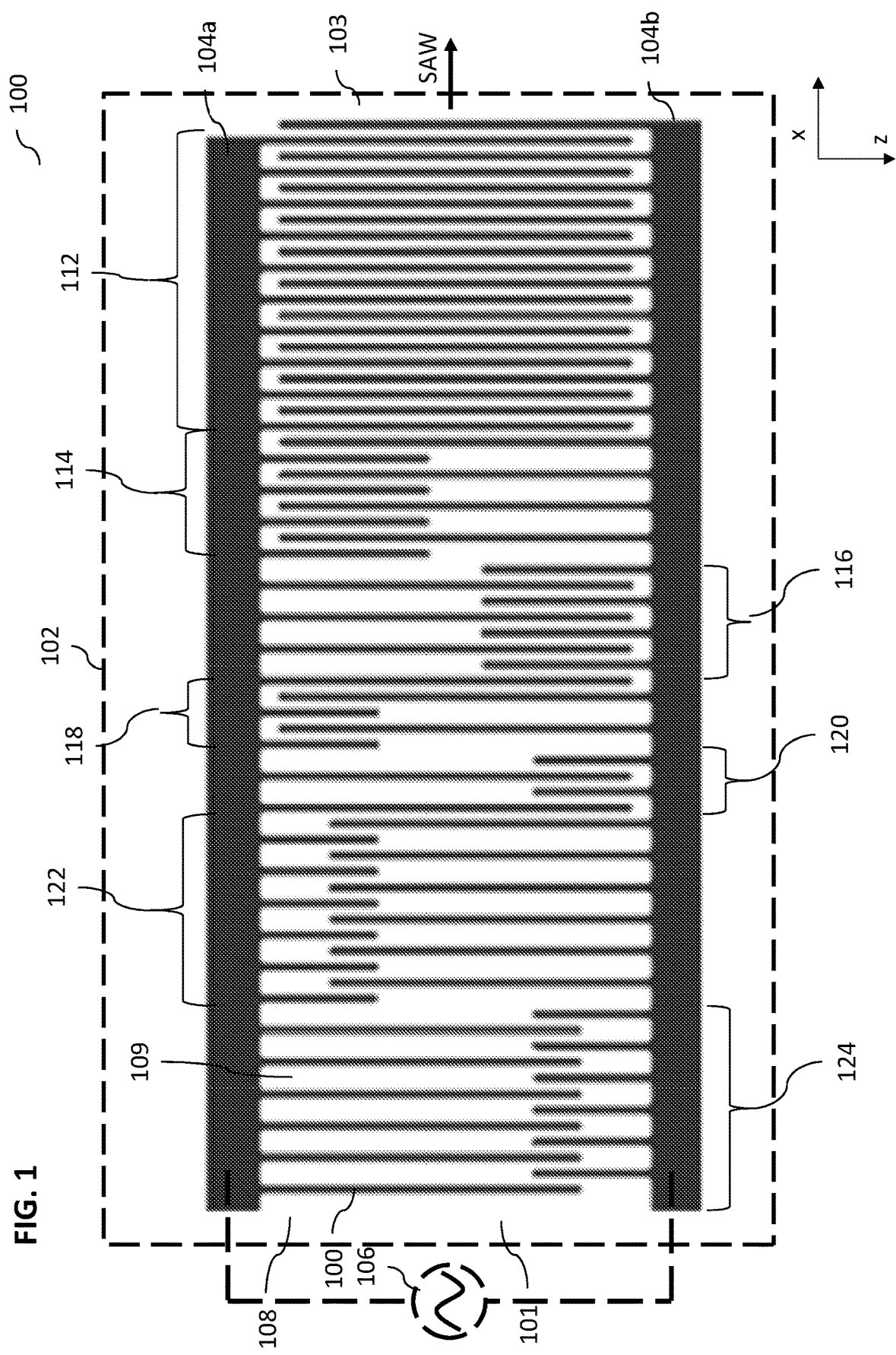
FIG. 1 illustrates an exemplary unapodized interdigital transducer (IDT), according to some implementations of the current subject matter.
Figure 2:
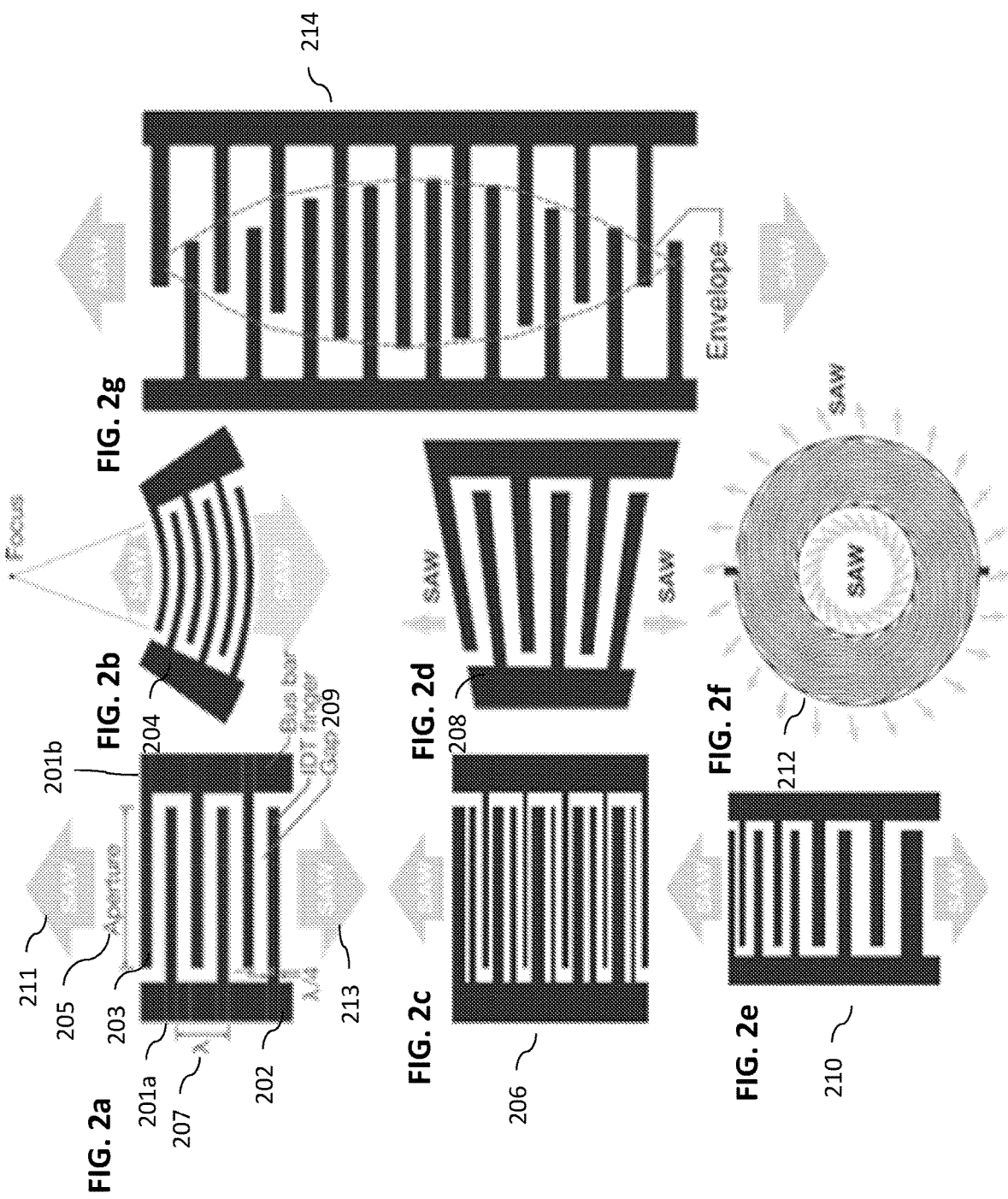
FIGS. 2A-2G illustrate exemplary existing transducers.

One or more implementations of the current subject matter relate to methods, systems, articles of manufacture, and the like that may, among other possible advantages, provide an ability to provide an unapodized interdigital transducer (IDT) capable of generating uniform surface acoustic waves.

In some implementations, the unapodized interdigital transducer may include a substrate, a pair of first electrodes (e.g., bus bars) oppositely positioned on the substrate, thereby forming an aperture between the pair of first electrodes, a plurality of variable length second electrodes (e.g., IDT fingers). Each such second electrode or finger (used interchangeably herein) may be coupled to one of the first electrodes and configured to extend into the aperture. The fingers may be arranged in an overlapping manner. The fingers may be arranged in pairs. Moreover, the fingers may have the same and/or different lengths and/or thicknesses. For example, at least one finger coupled to one of the bus bars has the same length as at least another finger coupled to another bus bar.

The pairs of fingers may be arranged in groups, where a first group, for example, an overlap between the fingers may be the largest and may extend substantially throughout the entire length of the aperture. In a second group, a length of the overlap between the figures may be smaller, e.g., half the length of the overlap in the first group. Moreover, the overlap may be arranged closer to one of the bus bars. In a third group, the length of the overlap may be the same as the length of the overlap in the second group, however, the finger overlap may be positioned closer to the opposite bus bar. Any subsequent groups of overlapping fingers may arranged in a similar fashion, where lengths of overlaps may be smaller and/or larger than the lengths of overlaps in other groups. The overlaps may also be positioned closer and/or father away from the bus bars. Each group of pairs of fingers may include any desired number of overlapping fingers. The fingers may be positioned predetermined distance(s) away from one another. The distances between fingers throughout the interdigital transducer may be the same and/or different. Moreover, the positioning of the overlaps and/or a number of finger pairs in each group may be the same and/or different, and may be specific to each application of the interdigital transducer.

The bus bars may be coupled to a source of electrical current that may apply electrical signal to the transducer's bus bars. Upon application of the electrical signal, the transducer may be configured to generate a surface acoustic wave (SAW). The surface acoustic wave may be uniform.

In some implementations, the current subject matter's interdigital transducer may be unapodized (which is different from the apodized transducer, which shapes the IDT to generate a desired electrical signal). The unapodized interdigital transducer, in view of its structural finger arrangement, may be configured to invert one or more governing equations to generate a desired spatial distribution of SAW at a defined position along a propagation direction of the SAW. In particular, experimental implementations of the current subject matter's unapodized IDT demonstrate a 50% improvement in the SAW uniformity over a conventional IDT, all while maintaining the same frequency, input power, quality factor, and electromechanical coupling, with a 50% increase in IDT area to accommodate the unapodization. One of the advantages of the current subject matter's IDT substantially eliminates the irregular dewetting and anomalous flows of a thin fluid film induced by traditional straight IDT SAW devices, whereby such flows become regular and uniform using the unapodized IDT devices (also referred to SAW devices and/or IDT SAW devices).

Surface acoustic waves have grown from their original use in communication systems as filters, delay lines or resonators to sensors and onward to become a versatile tool for quantum devices, optical applications and, notably, acoustofluidics. Indeed, some have seen fit to construct a road map of SAW to describe a few of these new uses. Most SAW devices employ a piezoelectric substrate covered by an interdigital electrode, forming an electromechanical transducer—an IDT.

The SAW transducer design is specific to the application. The electrode length and width, material, thickness, aperture, and number of fingers define the behavior of the transducer for a selected piezoelectric substrate. FIGS. 2a-g illustrate exemplary existing transducers 202-214, respectively.

As shown in FIG. 2a, the transducer 202 may include bus bars 201 (a, b) that may be positioned opposite one another (e.g., parallel to one another as shown in FIG. 2a) and one or more IDT fingers 203 coupled to the bus bars 201. The transducer 202 may be positioned on a substrate (not shown in FIG. 2a), e.g., a piezoelectric substrate, such as, for example, quartz, lithium niobate, etc. and may be coupled to (using bus bars 201) a source of an electrical current (not shown in FIG. 2a).

The bus bars 201 may be configured to form an aperture 205, into which fingers 203 may be configured to extend. The fingers 203 may be positioned in an interchanging manner, e.g., a pair of fingers 203 are coupled to bus bar 201a and another finger 203 is coupled to the opposite bus bar 201b and positioned between those fingers, whereby a gap 209 may be formed between fingers 203 coupled to opposite bus bars 201. As shown in FIG. 2a, the gap 209 may be uniform. The fingers 203 coupled to one bus bar 201 may be positioned a λ distance 207 apart. The gap 209 may be λ/4. Each finger 203 may also be λ/4 thick.

Upon application of an electrical signal to across the bus bars 201, the transducer 202 may be configured to generate one or more SAWs 211 and/or 213. The transducer 202 may serve as an input transducer (e.g., generating a SAW) and/or as an output transducer (e.g., receiving a SAW). One or more transducers 202 may be positioned on a single and/or multiple substrates. The transducer 202 may also include one or more external reflectors (not shown in FIG. 2a) that may be used to force the SAW to be unidirectional.

FIG. 2b illustrates an exemplary transducer 204 having curving of the electrodes or fingers. The transducer 204 laterally focuses acoustic energy as a focusing IDT (fIDT), either to a point in a circular fIDT or a line along the x axis in an elliptical fIDT, producing markedly different particle agglomeration and mixing results in sessile droplets.

FIG. 2c illustrates a single phase unidirectional transducer (SPUDT) 206. The transducer 206 may be configured as interdigitated interdigital transducer (IIDT). It may be used in acoustofluidics to reduce energy loss from the unused end of the IDT. The transducer 206 may have varying thickness fingers extending into the transducer's aperture. This increases the design's complexity by halving the feature size: the narrow fingers, as shown in FIG. 2c, are λ/8 wide and separated by λ/8 gaps, while the wider fingers are λ/4 wide.

FIG. 2d illustrates a transducer 208 configured as a tapered IDT (TIDT) structure. In the transducer 208, one of the bus bars are shorted than the other, thereby arranging fingers at an angle, rather than perpendicular to the bus bars. FIG. 2e illustrates a transducer 210 configured as a chirp IDT. In the transducer 210, thickness as well as distance between fingers decreases from end to the other. FIG. 2f illustrates a transducer 212 configured as a spiral IDT. The transducer 212 may be configured to have fingers arranged in a circular pattern thereby allowing generation of SAWs in an angular manner.

One or more of the above designs may be used in SAW-based telecommunication devices. A notable design feature of IDTs designed for telecommunications that has so far not appeared in acoustofluidics is apodization. In standard IDT designs (e.g., FIGS. 2a-f), the fingers of the IDT span the width of the gap between the bus bars. In an apodized transducer 214, shown in FIG. 2g, the finger length is axially shortened along the z-axis to form a desired envelope shape along the x-axis. This produces a spatial distribution of SAW generated from an input signal, in turn producing either a broad bandwidth response, a filtering behavior, or an encoding effect to serve specific communications applications.

Unfortunately, the designs shown in FIGS. 2a-g, while providing some advantages to the telecommunications industry do not address the problems in the field of acoustofluidics, such production of acoustic waves in manipulating fluids and/or colloids. In particular, the conventional designs produce intensity of the SAW that significantly varies across the aperture. Depending upon where the SAW is employed, Fresnel diffraction gives rise to very different intensity distributions across the aperture, whether near-field and/or far-field, and none of them are uniform. In a practical sense, this causes serious problems in using such devices in acoustofluidics. The induced fluid flow depends directly on the intensity of the SAW. Lateral (e.g., z-axis) variations in the SAW intensity cause recirculation, flow disruption, and peculiar patterns in the advancing meniscus, among other things. As such, conventional devices (e.g., shown in FIGS. 2a-g) produce non-uniform SAW causing non-uniform flow.

FIG. 1 illustrates an exemplary unapodized transducer or IDT 100, according to some implementations of the current subject matter. The transducer 100 may include a substrate 102, bus bars or electrodes 101 (a, b) that may be positioned opposite one another (e.g., parallel to one another as shown in FIG. 1), a plurality of IDT fingers or electrodes 110 coupled to the bus bars 104, and a source of electrical signal 106. The bars 101 may be arranged along the x-axis and fingers may be arranged along the z-axis, as shown in FIG. 1. The transducer 100 may include an input end 101 and an output end 103, whereby the transducer 100 may be configured to generate a SAW at the output end 103. Alternatively, or in addition to, the end 101 may be an output end and the end 103 may be an input end, whereby the transducer 100 may be configured to generate a SAW at the end 101.

The source of electrical signal 106 may be coupled to each bus bar 104. Further, while FIG. 1 illustrates that the source of electrical signal 106 is coupled to the bus bars 104 at the end 101, as can be understood, the source 106 may be coupled anywhere to the bus bars. The source 106 can be an alternating current source, a direct current source, and/or any other type of source of electrical signal.

The substrate 102 may be a piezoelectric substrate, such as, for example, quartz, lithium niobate, non-crystalline piezoelectric material (e.g., lead zirconate titanate), etc. and/or any other type of material.

The bus bars 104 may be configured to form an aperture 108, into which fingers 110 may be configured to extend. The fingers 110 may be positioned in an overlapping manner. For example, a pair of fingers 110 may be coupled to bus bar 104a, whereby another finger 110 coupled to the opposite bus bar 104b may be positioned between that pair of fingers 110.

A gap 109 may be formed between fingers 110 coupled to a bar 110. The gap 109 may be uniform, where fingers 110 coupled to one bus bar 104 and adjacent one another, may be positioned a λ distance apart. Alternatively, or in addition to, the gap 109 may be non-uniform, i.e., each pair of adjacent fingers may have its own gap that may be different from the gap of another pair of adjacent fingers. Each finger 110 may be positioned a predetermined distance from any other finger 110, e.g., the fingers 110 do not contact each other.

Each finger 110 may have a predetermined thickness. The thickness of fingers 110 may be uniform throughout the transducer 100. Alternatively, or in addition, at least one finger 110 may have a thickness that is different from at least another finger 110.

The fingers 110 may be arranged in one or more groups 112-124 as shown in FIG. 1. Each group 112-124 may include a predetermined number of fingers 110, where fingers 110 may be similarly and/or differently arranged within a group and/or across groups. For example, all fingers 110 (either connected to bus bar 104a or 104b) in the group 112 may be configured to extend throughout substantially the entire width of the aperture 108. Each finger 110 in group 112 may have same length, thickness, and/or gap with each neighbor finger.

In group 114, some fingers 110 may extend partially into the aperture 108 (e.g., approximately half way into the aperture 108), such as, fingers 110 that are connected to the bus bar 104a. The other fingers 110, such as, those connected to the opposite bus bar 104b, in group 114 may be configured to extend throughout substantially the entire width of the aperture 108. This creates a partial overlap of fingers 110 (as opposed to a substantially full overlap of fingers in group 112), whereby the gap 109 is smaller between some fingers and greater between others.

In somewhat symmetrical arrangement to group 114, in group 116, some fingers 110, i.e., those that are connected to bus bar 104b, may extend partially into the aperture 108 (e.g., approximately half way into the aperture 108). The fingers 110 connected to the opposite bus bar 104a may be configured to extend throughout substantially the entire width of the aperture 108.

Finger group 118 may include a fewer number of fingers than group 114, where fingers 110 connected to the bus bar 104a may be shorter than the fingers 110 in group 114 that are connected to bus bar 104a. The fingers 110 connected to bus bar 104b in group 118 may have the same length than the fingers 110 in group 114 connected to bus bar 104b.

Group 120 may have the same number of fingers as group 118 but may include a fewer number of fingers than group 116, where fingers 110 connected to the bus bar 104b may be shorter than the fingers 110 in group 116 that are connected to bus bar 104b. The fingers 110 connected to bus bar 104a in group 120 may have the same length than the fingers 110 in group 116 connected to bus bar 104a.

Finger group 122 may be arranged differently than groups 114 and 118 and may include a greater number of fingers than both groups 114, 118. In this group, fingers 110 connected to the bus bar 104a may be the same length as the fingers 110 in group 118, but shorter length than fingers in group 114 that are connected to bus bar 104a. The fingers 110 connected to bus bar 104b in group 122 may have a shorter length than the fingers 110 in either group 114 or group 118 connected to bus bar 104b.

Group 124 may be somewhat symmetrically arranged to group 122 and have the same number of fingers as group 122. Here, fingers 110 connected to the bus bar 104b may be the same length as the fingers 110 in group 120, but shorter length than fingers 110 in group 116 that are connected to bus bar 104b. The fingers 110 connected to bus bar 104a in group 124 may have a shorter length than the fingers 110 in either group 116 or group 120 connected to bus bar 104b.

The above arrangements of fingers, including different lengths of fingers 110 extending into the aperture 108, in groups 112-124 provides for a different type of overlapping of fingers 110. This allows for shaping of the SAW generated by the transducer 100 to make it more uniform.

The SAW may be generated by the transducer 100 by applying an electrical signal across the bus bars 104. As stated above, the transducer 100 may serve as an input transducer (e.g., generating a SAW) and/or as an output transducer (e.g., receiving a SAW). Input and output ends 101 and 103 may be interchangeable (e.g., either can be used to generate a SAW, receive a SAW, etc.) One or more transducers 100 may be positioned on a single and/or multiple substrates.

In some implementations, the IDT 100 may be designed to force a lateral (e.g., spatial, z-axis) distribution of the SAW amplitude to become uniform at a defined distance away from the IDT along the z-axis. It is generally not possible to make the SAW amplitude laterally uniform for all z. The choice of the value of z may define the IDT finger patterns (e.g., as shown in FIG. 1). The finger patterns are different from the existing apodization patterns, thereby producing an unapodized IDT. The unapodized IDT is advantageous over conventional apodized devices by being able to generate more uniform SAW amplitude distribution in manipulating thin fluid films, among other advantages.

In some implementations, the IDT 100 may be configured to generate a continuous unapodization. In particular, the pressure generated at the surface of the substrate from the generation of a SAW with an amplitude distribution is defined by the IDT's electrode pattern, as shown in FIG. 1. As a SAW is generated from a standard, full-width, unweighted IDT, its pressure distribution along the axis of propagation, x, and lateral to the axis of propagation, z, is defined by the following equation:

$$p(x, z, \omega) = \sqrt{\frac{\rho_0 c k v_0}{2\pi x}}\, e^{i\pi/4} e^{-ikz^2/2x} \int_{-\infty}^{\infty} e^{-ikz_0^2/2x} A(z_0) e^{ik(zz_0)/x} dz_0, \quad (1)$$

where $\omega$ is the applied angular frequency; $\rho_0$ is the density of the medium above the substrate; c and $v_0$ are the sound velocity and particle vibration velocity in the solid, respectively; k is the SAW wavenumber; $z_0$ is a dummy variable representing the position of the IDT structure along the z axis, and $A(z_0)$ is the amplitude of the SAW at a given point $z_0$.

Equation (1) may be used to describe presence and/or absence of the IDT finger(s) along the z axis direction. For example, the SAW amplitude at x=0 linearly increases with the number of IDT finger pairs at the resonance frequency. Thus, the same variable, $A(z_0)$ may be used to represent both the SAW amplitude for a given lateral position $z_0$ and also the number of IDT finger pairs at that position, with only a constant as a difference between them. In fact, the value of $A(z_0)$ is not as important as its distribution in defining the IDT pattern, as discussed below.

In view of the linear relationship between the generated SAW amplitude and the existence or absence of the fingers, then to have a valid solution, $A(z_0)$ must be positive definite for a particular value of $z_0$, where there is one or more IDT fingers present, and zero when there is not. This provides a means to define variable length IDT fingers. For reference, the position x=0, z=0 is located at the outer edge of the first IDT finger, at the center of the aperture. The aperture has a width, w, along the z-axis.

In some implementations, the IDT 100 may be designed to have a specific amplitude distribution, where an associated IDT finger 110 distribution $A(z_0)$ to obtain a constant acoustic pressure field $p(x, z, \omega)$ across the aperture 108. Specifically, given a set distance away from the IDT structure of x and an applied angular frequency $\omega$ corresponding to the resonance frequency of the IDT 100, the acoustic pressure field $p(x, z, \omega)$ may be constant for any value of $-w/2 < z < w/2$ within the aperture 108. Unfortunately, it is not possible to find a function $A(z_0)$ that produces a constant pressure $p(x, z, \omega)$ for all z and x values. In some exemplary implementations, a particular value for x may be selected to solve for $A(z_0)$ using equation (1) while keeping $p(x, z, \omega)$ constant, which may result in a desired distribution of $A(z_0)$.

Referring back to FIG. 2a, an existing IDT (e.g., IDT 202) typically generates a laterally uniform SAW amplitude $A(z_0)$ across the width of the aperture, because the IDT finger generates a constant electric field across the width. As a consequence, however, the pressure distribution generated across the width of the aperture according to Equation (1) at the edge of the IDT, at x=0, is not uniform. Further, the pressure is not uniform from this point as the SAW propagates along x. The current subject matter unapodized IDT solves this problem using the exemplary design shown in FIG. 1, as discussed herein.

In particular, in some exemplary implementations, the current subject matter may be configured to perform a discrete unapodization using the IDT 100 shown in FIG. 1. To determine an amplitude and IDT finger distribution $A(z_0)$ for a uniform $p(x, z, \omega)$ at any x distance from the IDT 100, the IDT 100 may be discretized along z-axis into n total intervals, using j, $m \in \{1, 2, \ldots, n\}$ as indices. Equation (1) may then become solvable in the $j^{th}$ interval to describe the pressures $p_1, p_2, \ldots, p_j, \ldots, p_n$, generated by the IDT 100 and consequent SAW amplitudes at x=0 in each ($m^{th}$) interval along z, $A_m$ are determined using the following set of equations $$p_1 = \Delta l \sqrt{p_0 \Gamma} \sum_{m=1}^{n} e^{i(\pi/4 - \pi\Gamma(1-m)^2\Delta l^2)} A_m, \qquad (2)$$

$$p_2 = \Delta l \sqrt{p_0 \Gamma} \sum_{m=1}^{n} e^{i(\pi/4 - \pi\Gamma(2-m)^2\Delta l^2)} A_m,$$

$$\vdots \qquad \vdots$$

$$p_j = \Delta l \sqrt{p_0 \Gamma} \sum_{m=1}^{n} e^{i(\pi/4 - \pi\Gamma(j-m)^2\Delta l^2)} A_m,$$

$$\vdots \qquad \vdots$$

$$p_n = \Delta l \sqrt{p_0 \Gamma} \sum_{m=1}^{n} e^{i(\pi/4 - \pi\Gamma(n-m)^2\Delta l^2)} A_m.$$

For each value of $m \in \{1, 2, \ldots, n\}$, $A_m$ may be constant in the $m^{th}$ interval, and $p_j$ is likewise constant in the $j^{th}$ interval. $\Delta I$ may be defined as a width of each IDT segment along z. Further, the total aperture 108 of the entire IDT 100, w, may be equally divided into n segments along z, $\Delta I = w/n$ (as shown in FIG. 1). The quantity $\Gamma$ may be defined as $\Gamma = (\lambda x)^{-1}$. Since $A_m$ are used to define relative values rather than absolute values of the amplitude and associated IDT distribution in the $m^{th}$ interval, the following equation may hold $$p_1 = p_2 = \ldots = p_n = \Delta l \sqrt{p_0 \Gamma}. \qquad (3)$$

Next, the desired distance from the IDT 100 along the SAW propagation direction where it is desired to have a uniform lateral distribution of the SAW, may be selected and defined using the variable s such that $x = s\lambda$. By solving the n equations in Equation set (2), solutions for the desired and discrete IDT intensity distribution $\{A_m\}$ (m=1, 2, . . . , n) may be determined.

At resonance, the SAW amplitude at x=0 and the $m^{th}$ interval linearly increases with the number of IDT finger pairs in that interval. This result from the discrete representation in Equation (2) corresponds to the continuous case described by Equation (1). As such, the number of IDT finger pairs for the $m^{th}$ interval required to obtain a laterally uniform SAW at position x, defined as $N_m$, may be proportional to the solution $\{A_m\}$ of Equation (2). If the solution $\{A_m\}$ is a rational number with a common denominator for all m, then the number of IDT finger pairs required, $N_m$, may be defined as the numerators of $A_m$ rounded to the nearest integers.

Figure 3:
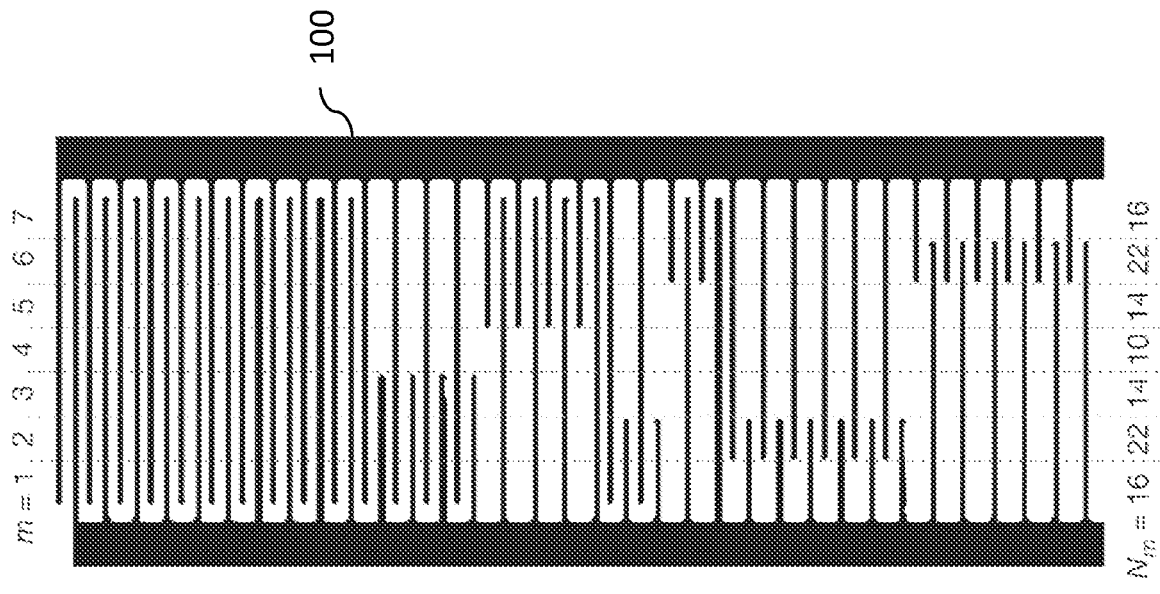
FIG. 3 illustrates a table illustrating exemplary IDT designs, according to some implementations of the current subject matter.

FIG. 3 illustrates a table 302 illustrating exemplary IDT designs (e.g., IDT 100 shown in FIG. 1) using the above approach to generate a uniform SAW distribution across an aperture at different $x = s\lambda$ positions and for different numbers of intervals, n. As n is increased, the aperture of the IDT is more finely divided. This will improve the uniformity of the resulting acoustic pressure across the aperture. However, there are two potential problems. First, the solution process is not entirely straightforward, even with the discrete definition provided in eqn. (2). For some choices of n and $x = s\lambda$, the solution $\{A_m\}$ may be invalid. Specifically, it may have some negative results for some of the intervals, implying that a "negative" number of IDT fingers should be used for those results. This may potentially be accommodated by introducing the corresponding fingers into the IDT 180 degrees out of phase with respect to the overall layout. Alternatively, or in addition, another value for n may be selected and analysis performed again, to generate suitable, positive definite results for $\{A_m\}$ at many different locations x, where a laterally uniform SAW may be desired. Second, an increase in value n may increase fabrication complexity, e.g., the number of intervals may increase, thereby implying that the variety of IDT finger lengths may increase, and thus, increasing a total number of fingers. These may be factors to consider in designing an unapodized IDT for a particular application.

Referring back to FIG. 3, in the design of the illustrated IDT 100, x=92 and n=7. By solving Equation (2) and clearing the denominator from the members of the solution set, the number of required IDT finger pairs for each of the n=7 intervals may be as follows: $N_m$=16, 22, 14, 10, 14, 22, 16. The solution is always symmetric about the center value (when n is odd) or values (when n is even). Each value in this particular set could be divided by two to reduce the number of required finger pairs, but we choose to proceed with $N_m$ as given. A suitable IDT may be constructed from this result as follows. The smallest number $N_m$ for any m is 10, thus, 10 finger pairs for all seven (n) intervals. For m=1, 2, 3, 5, 6, 7, additional four IDT finger pairs may be needed. Two more IDT finger pairs may be needed for intervals m=1, 2, 6, 7. Finally, 6 additional finger pairs may be needed for m=2, 6. Thus, the IDT 100 may need 34 finger pairs in total, as shown in FIG. 3.

Figure 4:
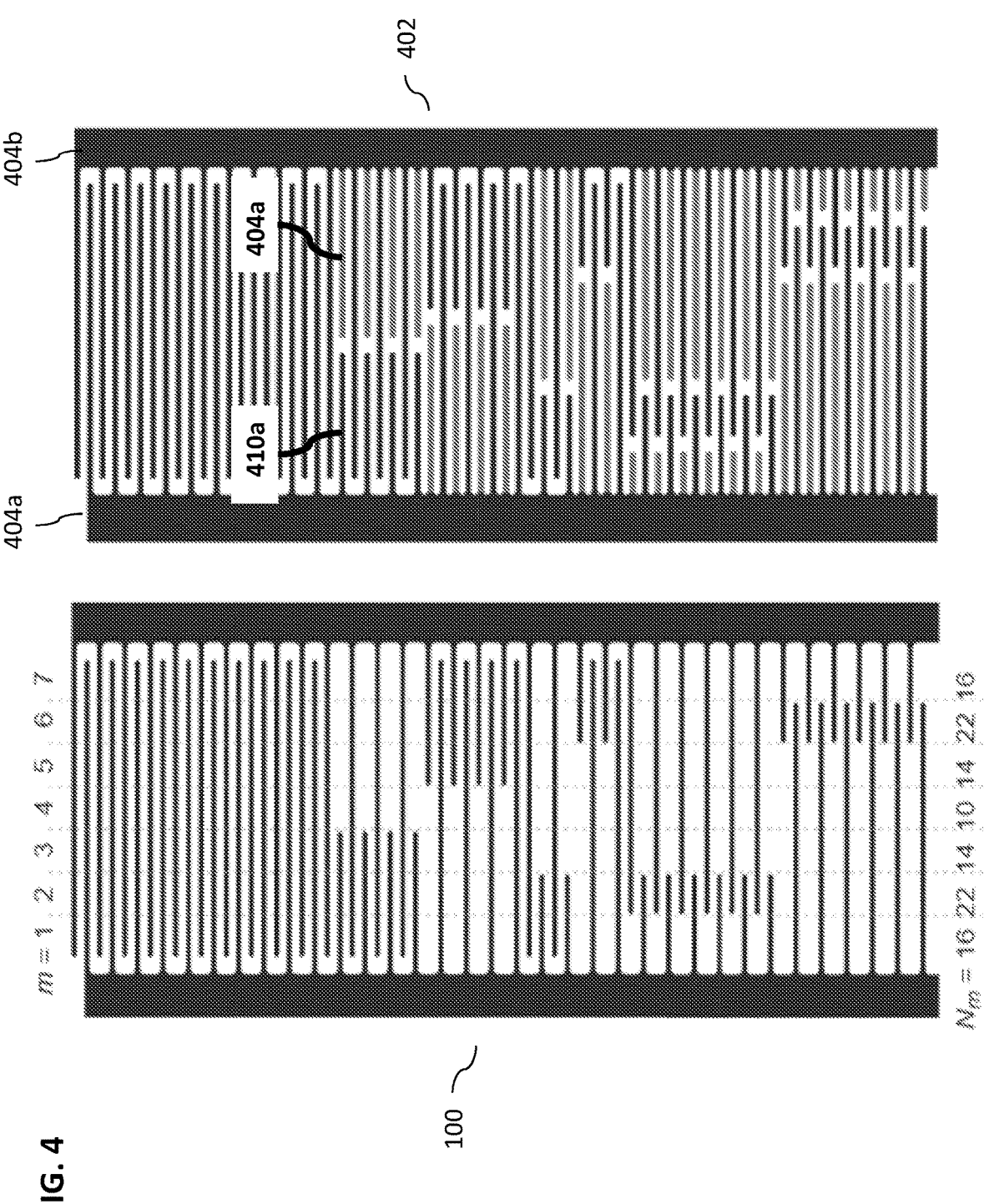
FIG. 4 illustrates the IDT shown in FIG. 1 and a modified IDT, according to some implementations of the current subject matter.

FIG. 4 illustrates the IDT 100 (as shown in FIG. 1) and a modified IDT 402, according to some implementations of the current subject matter. In the modified IDT 402, one or more dummy fingers may be inserted in spaces in the aperture, into which fingers do not extend. For example, a dummy finger 404a may be coupled to an electrode 404b (similar to electrode 104b) across a finger 410a (similar to finger 110) that may be coupled to an electrode 404a (similar to electrode 104a).

Apodization or unapodization of an IDT leads to a non-uniform distribution of fingers across the aperture. This is a problem because the fingers' presence on the substrate adds mass and reduces the propagation speed of the SAW they help to generate, leading to significant differences in this velocity across the aperture. Since this effect is proportional to the coupling coefficient $k^2_{eff}$, the SAW being formed in the IDT structure may be most distorted in substrates that have large electromechanical coupling, such as, lithium niobate. In conventional apodized IDTs without dummy fingers (as shown in FIG. 2g, for example), SAW propagating in the middle of the aperture encounters more electrode material, causing it to be slower than SAW at the edges.

In the current subject matter's unapodized IDT (e.g., IDT 100), the SAW may be fastest at the edges of the aperture 108 and slowest at its center. This may cause transmission discrepancies as the SAW tries to propagate out of some IDTs. The change in acoustic impedance from within some IDTs to the bare LN across the aperture may be sufficient to cause large SAW amplitude variations along the lateral direction z despite the unapodized IDT design. To avoid that, one or more dummy fingers 404 (as discussed above, additional electrode fingers connected to the opposing bus bar to avoid reflecting the propagating SAW) may be used. Such dummy fingers do not affect electrical properties of the transducer while improving uniformity of the SAW's propagation velocity across the aperture. Moreover, dummy fingers 404 may be helpful during fabrication, as they may regularize the pattern, thereby reducing the risk of over and/or under exposure issues during the lithography process.

Exemplary Experimental Implementations

In some exemplary, experimental, non-limiting implementations, using the $N_m$ integer solutions from Equation (2) with dummy fingers 404, as shown in FIG. 4, the IDT devices were fabricated on a double-side polished 127.86∘Y-rotated cut lithium niobate substrate (LN, as available from Precision Micro-Optics Inc., Burlington, MA, USA), with a thickness of 500 μm. The IDTs were designed to support a wavelength of λ=100 μm (i.e., f=40 MHz) as the minimum frequency possible for Rayleigh SAW using this LN thickness. Lower frequencies generate Lamb waves instead, which may leak energy from the back side of the wafer. The double-side polished LN may be normally associated with the risk of spurious bulk wave generation, and thus, single-side polished may be used in many applications. Here, we anticipated the use of these devices in inverted microscopy requiring a transparent substrate—albeit birefringent. The birefringence issue may be eliminated by using a linear polarizer between the LN and objective lens.

Absorbers (Dragon Skin™, as available from Smooth-On, Inc., Macungie, PA) were fabricated and used at both ends of the device to prevent edge reflections, triple-transit echoes, and spurious bulk waves. A SAW was generated by applying a sinusoidal electric signal to the IDT at the resonance frequency using a signal generator (WF1967 multifunction generator, as available from NF Corporation, Yokohama, Japan) and amplifier (5U1000, as available from Amplifier Research Corp., Souderton, Pennsylvania, USA).

The electrical properties (i.e., power, current, voltage), were measured using an oscilloscope (Infini Vision 2000 X-Series, as available from Keysight Technologies, Santa Rosa, CA). The spatiotemporal variations in the wave displacement and velocity amplitudes were measured using a scanning laser Doppler vibrometer (LDV, UHF-120SV, as available from Polytec, Waldbronn, Germany).

Experimental results from the unapodized IDT designs showed that a laterally uniform, flat-top SAW was developed at the desired design locations for three examples. These were compared to a standard, straight IDT with full-length fingers to illustrate the value of unapodization.

Figure 5:
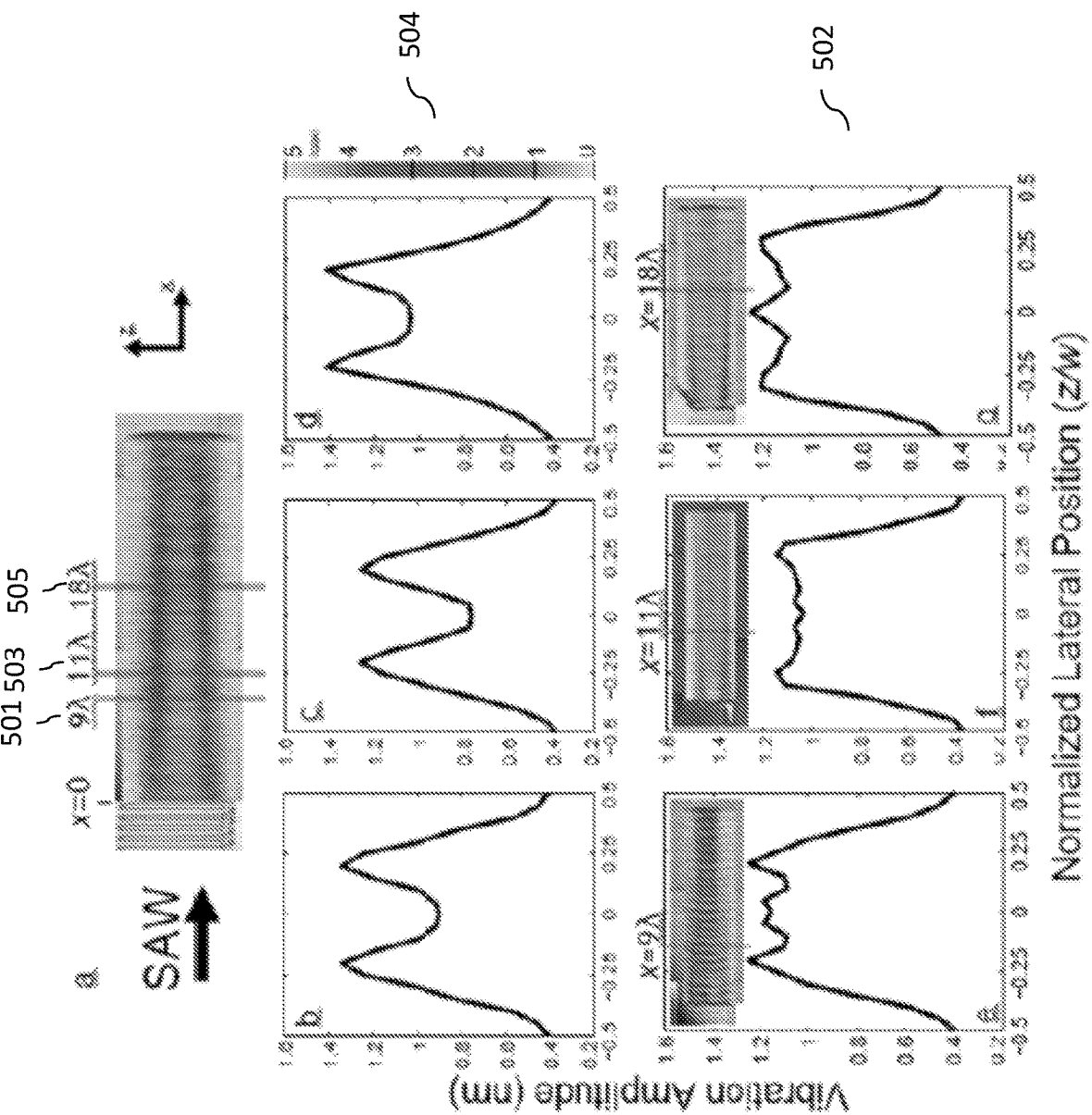
FIG. 5 illustrates various experimental surface acoustic wave (SAW) amplitude distributions.

The SAW amplitude distribution was measured using an LDV as it propagated from one straight and three unapodized IDT designs (as shown in FIG. 5). For the straight IDT design, the SAW forms a strongly non-uniform amplitude distribution across the aperture throughout the measurement region. This is illustrated in the cross-section amplitude plots in 504(*b-d*), taken at lines 501, 503, 505 corresponding to x=9λ, 11λ, and 18λ, respectively. There are two prominent peaks symmetrically placed about the weaker SAW present at the center of the aperture. It is important to note the relation between the amplitude and pressure of the SAW after it is fully formed by the IDT and is propagating across the LN substrate surface. The acoustic pressure p=$\rho_0$c A/ω depends upon the amplitude of the SAW, A, where $\rho_0$ is the density of the LN and ω is the operating frequency. This relation does not hold in the IDT where the SAW is being formed. Instead, Equations (1) and (2) are appropriate there. These equations may be used to determine the pressure distribution across the aperture at the edge of the IDT, x=0, and the SAW propagates from there across the bare LN substrate. The SAW amplitude as it propagates across the bare LN and beyond the IDT is directly proportional to the acoustic pressure in the substrate. By driving a uniform pressure distribution from the unapodized IDT to appear at a defined location x from the IDT, one obtains a matching, uniform SAW amplitude across the aperture (along z).

To confirm this, three unapodized IDT designs, {x=9λ, n=7}, {x=11λ, n=7}, and {x=18λ, n=6}, were selected to generate a uniform SAW at these same three locations, respectively, as shown by 502(*e-g*). An LDV was used to measure the SAW amplitude distribution as it propagated from each of these IDT designs at a resonance frequency of 38.3 MHz and an applied power of 520 mW. The lines in 502(*e-g*) correspond to the x=9λ, 11λ, and 18λ locations as used in the straight IDT results shown in 504(*b-d*). The unapodized designs generated far more uniform, flat-top SAW amplitude profiles than the straight IDT at the selected distances from the IDT. Elsewhere, the IDTs do exhibit a nonuniform SAW amplitude distribution, but it is apparent the uniformity is better than the straight IDT. This appears to support the notion that unapodization works. Improved results may be obtained by increasing n, the number of intervals used to define the unapodized pattern, at modest computational expense and perhaps a significant increase in fabrication effort.

The unapodization process discussed herein may work for a particular distance, x, away from the IDT. However, the change in the diffraction pattern in the far field—beyond about 10% from the IDT—with respect to axial position x may be slower than in the near field. A design chosen to produce a uniform SAW distribution across the aperture for a position x in the far field, therefore, could reasonably be expected to produce a uniform SAW distribution a greater range of the far field. Some evidence of this is seen in the SAW vibration amplitude contour plots in FIG. 5, e.g., 502(*f*, *g*) for the x=11λ and x=18λ unapodized IDT designs.

To quantify the uniformity of the SAW amplitude at the selected x locations in these three unapodized designs. The distribution of the amplitude discrepancies away from a uniform distribution in both the straight and unapodized designs is Gaussian, according to a Shapiro-Wilk test of the data for non-normal distribution, and so the standard deviation may be used. The straight IDT is expected to be the poorest performer, with a standard deviation of 0.17 nm, 0.18 nm, and 0.18 nm, respectively, at locations x=9λ, x=11λ, and x=18λ. By comparison, the standard deviation for each of the three unapodized designs, respectively, was 0.07 nm, 0.04 nm, and 0.04 nm at these same locations. Using the same applied power of 520 mW at an operating frequency of 38.3 MHz, the average vibration amplitude across the IDT aperture −w/2<z<w/2 was 1.10 nm, 1.01 nm, and 1.14 nm for the straight IDT at x=9λ, x=11λ, and x=18λ, respectively. These values are roughly similar, indicating the absence of loss typical of SAW LN devices in air. The values are also similar to the three corresponding amplitudes for the three unapodized designs at these three locations: 1.13 nm, 1.08 nm, and 1.16 nm for x=9λ, x=11λ, and x=18λ, respectively. The unapodized IDT designs exhibited similar SAW amplitudes for the same input power of 520 mW but superior uniformity across the aperture at the chosen design locations from the IDT. The improvement in uniformity as defined by a reduction in the standard deviation is greater than 50%.

This uniformity of the SAW comes at a cost of additional area required to define the partial fingers present in the unapodization, of just under 50%. Compared to the twenty finger pairs in the straight IDT design, considered to be near optimal for the selected frequency and substrate, the unapodized designs do have more finger pairs in total: 34 finger pairs for {x=9λ, n=7}, 30 pairs for {x=11λ, n=7}, and 25 pairs for {x=18λ, n=6}.

Another consideration is the effect the unapodization has on the electromechanical coupling coefficient, $k_{eff}$. Here, $k^2_{eff}$ may be determined based on measurements of the resonance and anti-resonance frequencies, far for the latter, using the following equation:

$$k^2_{eff} \approx \frac{\frac{\pi f_r}{2 f_{ar}}}{\tan\left(\frac{\pi f_r}{2 f_{ar}}\right)}. \tag{4}$$

Consistently, $f_r$=38.30 MHz while $f_{ar}$=40.44 MHz, 39.94 MHz, 39.98 MHz, and 39.93 MHz for the straight IDT design and the unapodized IDT designs with {x=9λ, n=7}, {x=11λ, n=7}, and {x=18λ, n=6}, respectively. This produced $k^2$=12.39%, 9.73%, 9.95%, and 9.67%, respectively. A quality factor, $Q \sim \delta^{-1}$ where δ is the damping coefficient: the larger the Q the less damping present in the system, may also be considered in designing the IDT. In designing an IDT, one may increase the number of finger pairs to produce a lower electromechanical coupling coefficient but greater quality factor. The performance of a SAW device depends on the product of the two, but before this is considered, the quality factor may be determined. Apodization may reduce the quality factor of shear horizontal SAW devices, leading to a more damped, broader frequency response. It may likewise happen in Rayleigh SAW devices, which could be problematic for a SAW device used in acoustofluidics.

The quality factor of the unapodized IDT was also calculated with respect to the straight IDT using the definition Q≈fr, where Δf is the full width at half maximum (FWHM), the measured width of the resonance peak at one-half its amplitude. This approximation is valid for Q>10, whereby the current subject matter's SAW devices typically have Q>>10. The quality factor is on the same order of magnitude whether or not the IDT is unapodized: Q=379.0, 316.3, and 210.9 for the three unapodized designs, respectively optimized for uniform SAW across the aperture at {x=9λ, n=7}, {x=11λ, n=7}, and {x=18λ, n=6} and in the same order as before. By comparison, the quality factor Q=276.6 for the straight IDT. As expected, there is a weak increase in the quality factor roughly associated with an increase in the number of finger pairs: 20, 25, 30, and 34 finger pairs produces Q=276.6, 210.9, 316.3, and 379.0. The 25-finger unapodized IDT design is lower, possibly because it is designed to produce a uniform SAW at x=8λ, closer to the near field, letting the far-field SAW become quite nonuniform. It appears that unapodization may slightly reduce the quality factor, but the effect of the number of fingers in a given IDT design is much stronger, suggesting a probable means to overcome a low quality factor in a given design: increase the number of finger pairs. This can be achieved in the unapodized designs by multiplying by a suitable rational number greater than one to retain integers from the solution {Nm}.

The product $Qk^2_{eff}$ may be useful as a figure of merit. Once again in order, the four designs produce $Qk^2_{eff}$=34.3, 36.9, 31.5, and 20.4, not a significant difference: within two (sample-size corrected) standard deviations of the mean for this small sample size of four.

Figure 6:
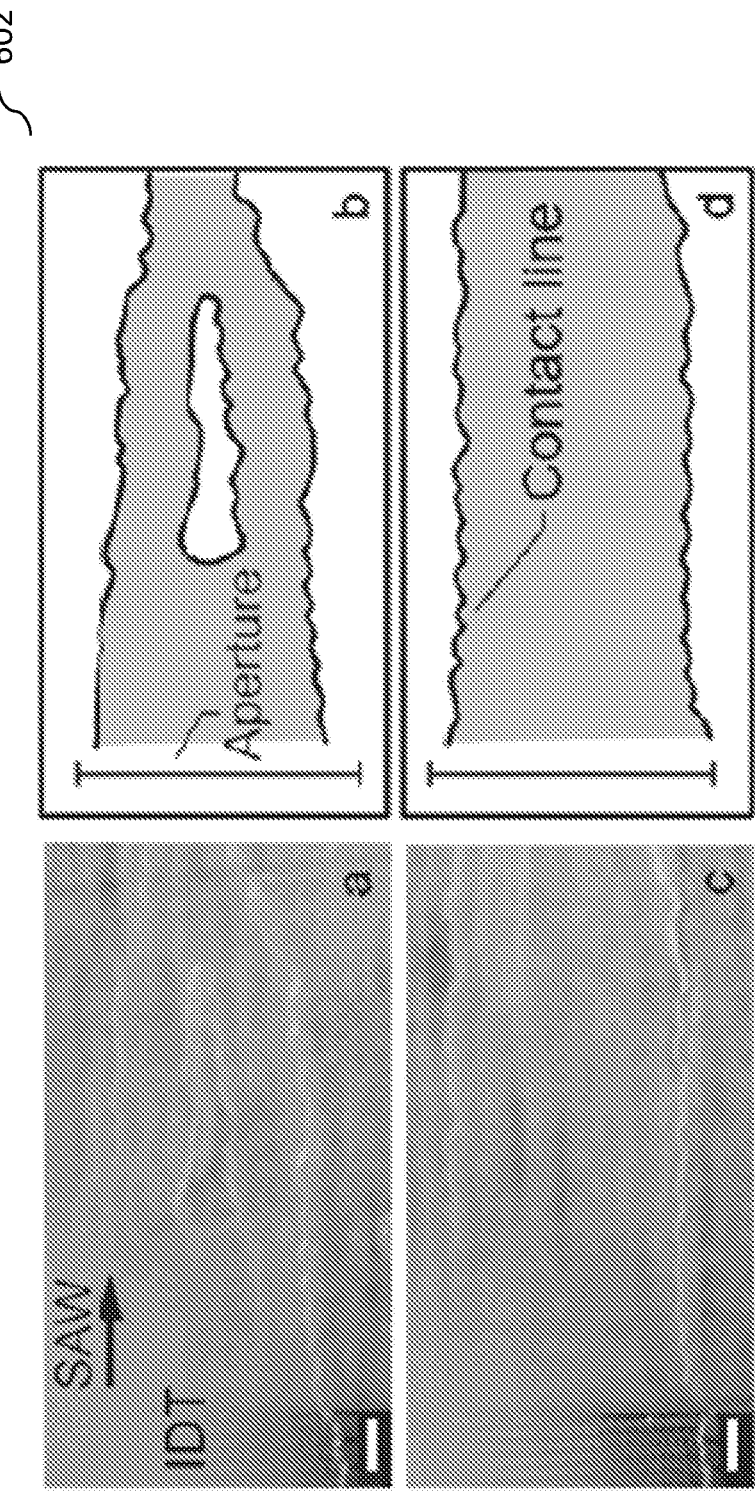
FIG. 6 illustrates exemplary, experimental impact diagrams of a uniform SAW amplitude distribution on the generation of flow in thin liquid films, according to some implementations of the current subject matter.

FIG. 6 illustrates exemplary, experimental impact diagrams 602 (*a*, *b*, *c*, *d*) of a uniform SAW amplitude distribution on the generation of flow in thin liquid films, according to some implementations of the current subject matter. A 38.3 MHz SAW with applied power of 1.85 W interacted with a thin film of approximately 1 μL silicone oil (viscosity 20 cSt, #378348, as available from Sigma-Aldrich, St. Louis, MO USA) pipetted onto the unapodized, {x=18λ, n=6} IDT and a straight IDT SAW device for comparison. In particular, FIG. 6 illustrates an exemplary distribution of oil wetting for two types of devices, and notably indicates a clear difference between the two. Compared to non-uniform propagation of the fluid film due to the nonuniform SAW in the straight IDT design, the unapodized IDT exhibits a broadly uniform wetting and meniscus shape. Further, the intense SAW present at the IDT center dewets the film in the straight IDT design, a feature not present in the unapodized system. This hints at the broader potential of unapodized IDT designs in producing uniform SAW and therefore uniform fluid flow useful in a majority of acoustofluidics applications.

In some implementations, the current subject matter relates to an apparatus, that may include an unapodized interdigital transducer ("IDT", "transducer", and/or "SAW device"). The apparatus may include a substrate (e.g., substrate 102). It may also include a pair of first electrodes (e.g., bus bars 104 (*a*, *b*)) oppositely positioned on the substrate. An aperture (e.g., aperture 108) is formed between the pair of first electrodes. Further, the apparatus may include a plurality of variable length second electrodes (e.g., fingers 110) arranged using a predetermined pattern (e.g., as shown in FIG. 1). The pattern may be defined by each second electrode in the plurality of second electrodes being coupled to one of the first electrodes in the pair of first electrodes and being configured to extend into the aperture. At least one second electrode in the plurality of second electrodes that may be coupled to one of the first electrodes in the pair of first electrodes has the same length as at least another second electrode in the plurality of second electrodes coupled to another first electrode in the pair of first electrodes (e.g., electrodes in group 112 shown in FIG. 1). A surface acoustic wave may be generated by the apparatus upon application of electrical current to the pair of the first electrodes (e.g., using electrical current source 106).

In some implementations, the current subject matter may include one or more of the following optional features. The pair of first electrodes and the plurality of variable length second electrodes may form an unapodized interdigital transducer disposed on the substrate.

In some implementations, the plurality of second electrodes may be arranged in a plurality of pairs of second electrodes. The second electrodes in a pair of second electrodes in the plurality of pairs may have same length. Alternatively, or in addition to, second electrodes in a pair of second electrodes in the plurality of pairs may be have a different length (e.g., electrodes in groups 114-124).

In some implementations, at least one second electrode in the plurality of second electrodes may have a first thickness and at least another second electrode in the plurality of second electrodes has a second thickness. The first thickness being different from the second thickness (e.g., similar to electrodes shown in FIG. 2c).

In some implementations, the interdigital transducer may be at least one of: an output interdigital transducer and an input interdigital transducer.

In some implementations, the surface acoustic wave may be a uniform surface acoustic wave.

In some implementations, the apparatus may also include a plurality of variable length non-conducting third electrodes (e.g., dummy electrodes 404). Each non-conducting third electrode in the plurality of non-conducting third electrodes may be coupled to at least one first electrode in the pair of first electrodes. At least one non-conducting third electrode may be positioned opposite to at least one second electrode in the plurality of second electrodes (e.g., as shown in FIG. 4).

In some implementations, the plurality of second electrodes may be arranged in one or more groups of second electrodes (e.g., groups 112-124). At least group of second electrodes may include at least one second electrode having a different length than a length of at least another second electrode in at least another group (e.g., groups 116 and 118).

In some implementations, each pair of adjacent second electrodes in the plurality of second electrodes are coupled to the same first electrode in the pair of first electrodes and are positioned a predetermined distance apart.

In some implementations, the predetermined pattern may be dependent on a distribution of an amplitude of the generated surface acoustic wave determined at one or more locations corresponding to positions of one or more second electrodes in the plurality of second electrodes within the aperture. The predetermined pattern of the plurality of second electrodes may be configured to cause generation of a predetermined acoustic pressure across the aperture. The predetermined acoustic pressure may be constant. Alternatively, or in addition to, the predetermined acoustic pressure may be configured to vary at each location corresponding to a position of each second electrode in the plurality of second electrodes within the aperture.

Figure 7:
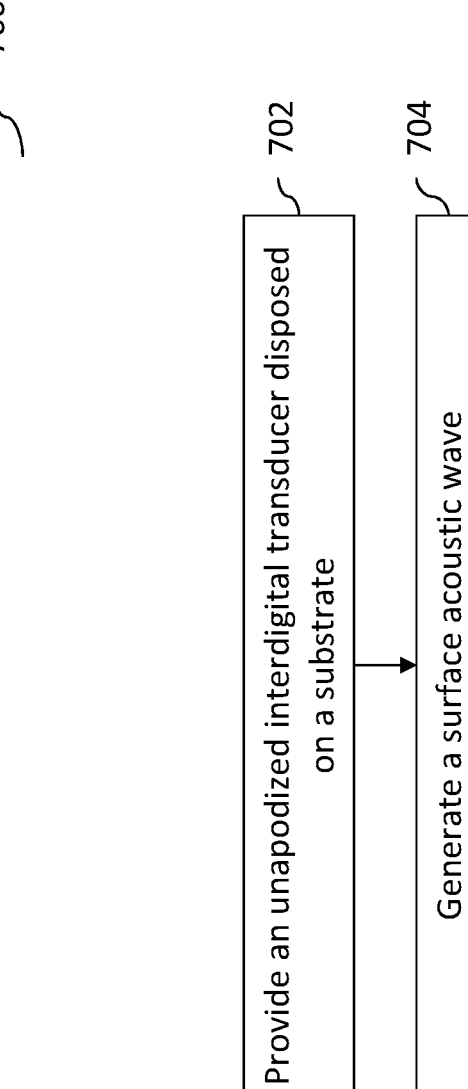
FIG. 7 illustrates an exemplary method, according to some implementations of the current subject matter.

FIG. 7 illustrates an exemplary method for operating the unapodized interdigital transducer ("IDT", "transducer", and/or "SAW device"), as described above and/or shown in FIGS. 1-6. At 702, an unapodized interdigital transducer disposed on a substrate may be provided. The unapodized interdigital transducer including a pair of first electrodes oppositely positioned on the substrate, wherein an aperture is formed between the pair of first electrodes, and a plurality of variable length second electrodes arranged using a predetermined pattern defined by each second electrode in the plurality of second electrodes being coupled to one of the first electrodes in the pair of first electrodes and being configured to extend into the aperture. At least one second electrode in the plurality of second electrodes that may be coupled to one of the first electrodes in the pair of first electrodes may have the same length as at least another second electrode in the plurality of second electrodes coupled to another first electrode in the pair of first electrodes. At 704, a surface acoustic wave may be generated upon application of electrical current to the pair of the first electrodes.

In some implementations, the providing may also include determining a distribution of an amplitude of the generated surface acoustic wave determined at one or more locations corresponding to positions of one or more second electrodes in the plurality of second electrodes within the aperture, and generating the predetermined pattern, including selecting a number of second electrodes for positioning within the aperture, determining corresponding lengths of selected electrodes, and determining positions of the selected electrodes.

In some implementations, design of an unapodized IDT may implement use of one or more integrated and/or external reflectors, thereby converting a single-phase unidirectional interdigital transducer (SPUDT) (e.g., as shown in FIG. 2c) into an unapodized IDT, such that, the lateral distribution of the SAW is as desired a fixed distance from the SPUDT while ensuring the SAW is generated principally from one side of the aperture alone.

In some implementations, the current subject matter's unapodization processes and/or designs, as discussed herein, may likewise be applied to chirp transducers (e.g., as shown in FIG. 2e), focusing transducers (e.g., as shown in FIG. 2b), tapered transducers (e.g., as shown in FIG. 2d), and/or stepped interdigital transducers to facilitate a lateral distribution of the SAW amplitude on the substrate to render it uniform at a desired distance from the IDT.

The systems and methods disclosed herein can be embodied in various forms including, for example, a data processor, such as a computer that also includes a database, digital electronic circuitry, firmware, software, or in combinations of them. Moreover, the above-noted features and other aspects and principles of the present disclosed implementations can be implemented in various environments. Such environments and related applications can be specially constructed for performing the various processes and operations according to the disclosed implementations or they can include a general-purpose computer or computing platform selectively activated or reconfigured by code to provide the necessary functionality. The processes disclosed herein are not inherently related to any particular computer, network, architecture, environment, or other apparatus, and can be implemented by a suitable combination of hardware, software, and/or firmware. For example, various general-purpose machines can be used with programs written in accordance with teachings of the disclosed implementations, or it can be more convenient to construct a specialized apparatus or system to perform the required methods and techniques.

These computer programs, which can also be referred to as programs, software, software applications, applications, components, or code, include machine instructions for a programmable processor, and can be implemented in a high-level procedural and/or object-oriented programming language, and/or in assembly/machine language. As used herein, the term "machine-readable medium" refers to any computer program product, apparatus and/or device, such as for example magnetic discs, optical disks, memory, and Programmable Logic Devices (PLDs), used to provide machine instructions and/or data to a programmable processor, including a machine-readable medium that receives machine instructions as a machine-readable signal. The term "machine-readable signal" refers to any signal used to provide machine instructions and/or data to a programmable processor. The machine-readable medium can store such machine instructions non-transitorily, such as for example as would a non-transient solid state memory or a magnetic hard drive or any equivalent storage medium. The machine-readable medium can alternatively or additionally store such machine instructions in a transient manner, such as for example as would a processor cache or other random access memory associated with one or more physical processor cores.

To provide for interaction with a user, the subject matter described herein can be implemented on a computer having a display device, such as for example a cathode ray tube (CRT), a liquid crystal display (LCD) monitor, a head-mounted display (HMD), a holographic display, etc. for displaying information to the user and a keyboard and a pointing device, such as for example a mouse or a trackball, by which the user can provide input to the computer. Other kinds of devices can be used to provide for interaction with a user as well. For example, feedback provided to the user can be any form of sensory feedback, such as for example visual feedback, auditory feedback, or tactile feedback; and input from the user can be received in any form, including, but not limited to, acoustic, speech, or tactile input.

The subject matter described herein can be implemented in a computing system that includes a back-end component, such as for example one or more data servers, or that includes a middleware component, such as for example one or more application servers, or that includes a front-end component, such as for example one or more client computers having a graphical user interface or a Web browser through which a user can interact with an implementation of the subject matter described herein, or any combination of such back-end, middleware, or front-end components. The components of the system can be interconnected by any form or medium of digital data communication, such as for example a communication network. Examples of communication networks include, but are not limited to, a local area network ("LAN"), a wide area network ("WAN"), and the Internet.

The computing system can include clients and servers. A client and server are generally, but not exclusively, remote from each other and typically interact through a communication network. The relationship of client and server arises by virtue of computer programs running on the respective computers and having a client-server relationship to each other.

Although ordinal numbers such as first, second, and the like can, in some situations, relate to an order; as used in this document ordinal numbers do not necessarily imply an order. For example, ordinal numbers can be merely used to distinguish one item from another. For example, to distinguish a first event from a second event, but need not imply any chronological ordering or a fixed reference system (such that a first event in one paragraph of the description can be different from a first event in another paragraph of the description).

The foregoing description is intended to illustrate but not to limit the scope of the invention, which is defined by the scope of the appended claims. Other implementations are within the scope of the following claims.

The implementations set forth in the foregoing description do not represent all implementations consistent with the subject matter described herein. Instead, they are merely some examples consistent with aspects related to the described subject matter. Although a few variations have been described in detail above, other modifications or additions are possible. In particular, further features and/or variations can be provided in addition to those set forth herein. For example, the implementations described above can be directed to various combinations and sub-combinations of the disclosed features and/or combinations and sub-combinations of several further features disclosed above. In addition, the logic flows depicted in the accompanying figures and/or described herein do not necessarily require the particular order shown, or sequential order, to achieve desirable results. Other implementations can be within the scope of the following claims.

What is claimed:

1. An apparatus, comprising:
a substrate;
a pair of first electrodes oppositely positioned on the substrate, wherein an aperture is formed between the pair of first electrodes;
a plurality of variable length second electrodes arranged using a predetermined pattern defined by each second electrode in the plurality of second electrodes being coupled to one of the first electrodes in the pair of first electrodes and being configured to extend into the aperture, wherein at least one second electrode in the plurality of second electrodes coupled to one of the first electrodes in the pair of first electrodes has the same length as at least another second electrode in the plurality of second electrodes coupled to another first electrode in the pair of first electrodes;
wherein the plurality of second electrodes are arranged in a plurality of groups of second electrodes extending from one of the first pair of electrodes, a first group in the plurality of groups of second electrodes includes a plurality of adjacent second electrodes extending less than halfway across the aperture and having a first length and a second group of the plurality of groups of second electrodes extending at least halfway across the aperture and having a second length different than the first length,
wherein the plurality of second electrodes include a third group of electrodes extending from the another first electrode and extending at least halfway across the aperture and between each of the adjacent electrodes of the first group in the plurality of groups of second electrodes,
wherein a surface acoustic wave is generated upon application of electrical current to the pair of the first electrodes.

2. The apparatus according to claim 1, wherein the pair of first electrodes and the plurality of variable length second electrodes form an unapodized interdigital transducer disposed on the substrate.

3. The apparatus according to claim 1, wherein the plurality of second electrodes are arranged in a plurality of pairs of second electrodes.

4. The apparatus according to claim 3, wherein second electrodes in a pair of second electrodes in the plurality of pairs have same length.

5. The apparatus according to claim 3, wherein second electrodes in a pair of second electrodes in the plurality of pairs have different length.

6. The apparatus according to claim 1, wherein at least one second electrode in the plurality of second electrodes has a first thickness and at least another second electrode in the plurality of second electrodes has a second thickness, the first thickness being different from the second thickness.

7. The apparatus according to claim 2, wherein the interdigital transducer is at least one of an output interdigital transducer and an input interdigital transducer.

8. The apparatus according to claim 1, wherein the surface acoustic wave is a uniform surface acoustic wave.

9. The apparatus according to claim 1, further comprising a plurality of variable length non-conducting third electrodes, wherein each non-conducting third electrode in the plurality of non-conducting third electrodes is coupled to at least one first electrode in the pair of first electrodes.

10. The apparatus according to claim 9, wherein at least one non-conducting third electrode is positioned opposite to at least one second electrode in the plurality of second electrodes.

11. The apparatus according to claim 1, wherein the plurality of second electrodes are arranged in one or more groups of second electrodes, at least group in the one or more groups of second electrodes includes at least one second electrode having a different length than a length of at least another second electrode in at least another group in the one or more groups of second electrodes.

12. The apparatus according to claim 1, wherein each pair of adjacent second electrodes in the plurality of second electrodes are coupled to the same first electrode in the pair of first electrodes and are positioned a predetermined distance apart.

13. The apparatus according to claim 1, wherein the predetermined pattern is dependent on a distribution of an amplitude of the generated surface acoustic wave determined at one or more locations corresponding to positions of one or more second electrodes in the plurality of second electrodes within the aperture.

14. The apparatus according to claim 13, wherein the predetermined pattern of the plurality of second electrodes is configured to cause generation of a predetermined acoustic pressure across the aperture.

15. The apparatus according to claim 14, wherein the predetermined acoustic pressure is constant.

16. The apparatus according to claim 14, wherein the predetermined acoustic pressure is configured to vary at each location corresponding to a position of each second electrode in the plurality of second electrodes within the aperture.

17. A method, comprising:

providing an unapodized interdigital transducer disposed on a substrate, the unapodized interdigital transducer including a pair of first electrodes oppositely positioned on the substrate, wherein an aperture is formed between the pair of first electrodes;

a plurality of variable length second electrodes arranged using a predetermined pattern defined by each second electrode in the plurality of second electrodes being coupled to one of the first electrodes in the pair of first electrodes and being configured to extend into the aperture, wherein at least one second electrode in the plurality of second electrodes coupled to one of the first electrodes in the pair of first electrodes has the same length as at least another second electrode in the plurality of second electrodes coupled to another first electrode in the pair of first electrodes;

wherein the plurality of second electrodes are arranged in a plurality of groups of second electrodes extending from one of the first pair of electrodes, a first group in the plurality of groups of second electrodes includes a plurality of adjacent second electrodes extending less than halfway across the aperture and having a first length and a second group of the plurality of groups of second electrodes extending at least halfway across the aperture and having a second length different than the first length, wherein the plurality of second electrodes include a third group of electrodes extending from the another first electrode and extending at least halfway across the aperture and between each of the adjacent electrodes of the first group in the plurality of groups of second electrodes, and generating a surface acoustic wave, upon application of electrical current to the pair of the first electrodes.

18. The method according to claim 17, wherein the providing includes determining a distribution of an amplitude of the generated surface acoustic wave determined at one or more locations corresponding to positions of one or more second electrodes in the plurality of second electrodes within the aperture;

generating the predetermined pattern, including selecting a number of second electrodes for positioning within the aperture, determining corresponding lengths of selected electrodes, and determining positions of the selected electrodes.

19. The apparatus according to claim 1, further comprising:

a fourth group of electrodes in the plurality of groups of second electrodes includes a plurality of adjacent second electrodes extending substantially the entire width of the aperture from the one of the first pair of electrodes; and a fifth group of electrodes extending from the another first electrode between each of the adjacent electrodes of the fourth group in the plurality of groups of second electrodes and extending substantially the entire width of the aperture.

20. The apparatus according to claim 1, the fourth group of electrodes and the fifth group of electrodes being down stream of the first, second, and third group of electrodes.

\*   \*   \*   \*   \*